United States Patent
Ayazi et al.

(10) Patent No.: US 9,154,108 B2
(45) Date of Patent: Oct. 6, 2015

(54) SELF-POLARIZED CAPACITIVE MICROMECHANICAL RESONATOR APPARATUS AND FABRICATION METHOD

(76) Inventors: Farrokh Ayazi, Atlanta, GA (US); Ashwin Samarao, San Jose, CA (US)

( * ) Notice: Subject to any disclaimer, the term of this patent is extended or adjusted under 35 U.S.C. 154(b) by 146 days.

(21) Appl. No.: 13/808,363

(22) PCT Filed: Jul. 6, 2011

(86) PCT No.: PCT/US2011/043019
§ 371 (c)(1),
(2), (4) Date: Jan. 4, 2013

(87) PCT Pub. No.: WO2012/006314
PCT Pub. Date: Jan. 12, 2012

(65) Prior Publication Data
US 2013/0106533 A1    May 2, 2013

Related U.S. Application Data

(60) Provisional application No. 61/361,553, filed on Jul. 6, 2010.

(51) Int. Cl.
| | |
|---|---|
| *H03H 9/24* | (2006.01) |
| *H03H 3/007* | (2006.01) |
| *H03H 9/02* | (2006.01) |
| *H01G 4/012* | (2006.01) |
| *H01G 4/12* | (2006.01) |

(52) U.S. Cl.
CPC ........... *H03H 9/2405* (2013.01); *H03H 3/0072* (2013.01); *H03H 9/02007* (2013.01); *H03H 9/24* (2013.01); *H01G 4/012* (2013.01); *H01G 4/12* (2013.01); *H03H 2009/02251* (2013.01); *H03H 2009/02496* (2013.01); *Y10T 29/49002* (2015.01); *Y10T 29/49117* (2015.01)

(58) Field of Classification Search
CPC ....... H01G 4/012; H01G 4/12; H03H 3/0072; H03H 9/02007; H03H 9/24; H03H 9/2405; H03H 2009/02251; H03H 2009/02496; Y10T 29/49117; Y10T 29/49002
USPC ............... 333/186, 187; 29/592.1, 825, 25.35
See application file for complete search history.

(56) References Cited

U.S. PATENT DOCUMENTS

| | | |
|---|---|---|
| 5,628,917 A | 5/1997 | Macdonald et al. |
| 7,023,065 B2 | 4/2006 | Ayazi et al. |

(Continued)

OTHER PUBLICATIONS

Bahl, et al., Model and Observations of Dielectric Charge in Thermally Oxidized Silicon Resonators Journal of Microelectromechanical Systems, vol. 19, No. 1 Feb. 2010.

*Primary Examiner* — Benny Lee
*Assistant Examiner* — Jorge Salazar, Jr.
(74) *Attorney, Agent, or Firm* — Burns & Levinson LLP; Bruce D. Jobse

(57) ABSTRACT

The present invention is directed towards a self-polarized capacitive micromechanical resonator apparatus and fabrication method. The apparatus includes a body member capable of retaining a polarization charge in the absence of a polarization voltage source. By creating potential wells or charge traps on the surface of the resonant body member through a nitrogen diffusing process, charges may be trapped in the charge traps. Unless perturbed externally, the charges remain trapped thus enabling a self-polarization technique without the need for any externally applied polarization voltage.

16 Claims, 8 Drawing Sheets

(56) References Cited

U.S. PATENT DOCUMENTS

| | | |
|---|---|---|
| 7,170,369 B2 * | 1/2007 | Huang et al. .................. 333/186 |
| 7,619,493 B2 | 11/2009 | Uno et al. |
| 2006/0044078 A1 | 3/2006 | Ayazi et al. |
| 2006/0103561 A1 | 5/2006 | Abe et al. |
| 2006/0290449 A1 * | 12/2006 | Piazza et al. .................. 333/187 |
| 2009/0057792 A1 | 3/2009 | Steeneken et al. |
| 2010/0060111 A1 | 3/2010 | Ayazi et al. |

* cited by examiner

SELF-POLARIZED CAPACITIVE MICROMECHANICAL RESONATOR APPARATUS AND FABRICATION METHOD

CROSS-REFERENCE TO RELATED APPLICATIONS

This application is a U.S. national stage application under 35 U.S.C, 371 of international Application No, PCT/US11/43019 filed on Jul. 6, 2011 and entitled SELF-POLARIZED CAPACITIVE MICROMECHANICAL RESONATOR APPARATUS AND FABRICATION METHOD, which in turn claims priority to U.S. Provisional Patent Application No. 61/361,553 filed on Jul. 6, 2010, both of which are incorporated by reference herein in their entirety for all purposes.

FIELD OF THE INVENTION

The present invention relates to micromechanical resonators, and, more specifically, to self-polarized capacitive micromechanical resonators.

BACKGROUND OF THE INVENTION

After nearly four decades of continued interest and research, silicon micromechanical resonators/oscillators are finally being commercialized for timing and frequency control applications. Among the many available transduction schemes for silicon microresonators, piezoelectric and capacitive mechanisms have been extensively explored over the years due to their individual superior performances. While the former offers lower motional impedance and relative ease of fabrication, the latter offers a very high fQ (resonance frequency×quality factor) product that translates to low-jitter in oscillators and high-precision in resonant sensor systems. However, the additional circuitry needed to generate the DC polarization voltage ($V_p$) for capacitive actuation renders such oscillators and sensor systems incompatible with low voltage processes. One approach to alleviate the need for an externally-applied DC voltage is to use the resonant silicon microstructures suspended on the oxide layer of a Silicon on insulator (SOI) as capacitors to store charges. However, a DC bias source is still needed to start-up the resonator and to intermittently replenish the leaked charges.

Accordingly, there is a need for capacitive mechanism solutions that do not require an externally-applied DC voltage or DC bias source.

SUMMARY OF THE INVENTION

The present invention is directed towards a self-polarized capacitive micromechanical resonator that includes a body member capable of retaining a polarization charge in the absence of a polarization voltage source. By creating potential wells or charge traps on the surface of the resonant body member through a nitrogen diffusing process, charges may be trapped in the charge traps. Unless perturbed externally, the charges remain trapped thus enabling a self-polarization technique without the need for any externally applied $V_p$. Accordingly, a self-polarized capacitive micromechanical resonator having charge traps may be able to operate without the need of an externally applied $V_p$.

In one aspect of the present disclosure, a self-polarized capacitive micromechanical resonator apparatus includes a resonant body member having a surface characterized by multiple charge traps and further capable of retaining a polarization charge without an active polarization voltage source. The self-polarized capacitive micromechanical resonator apparatus also includes at least one electrode that is separated from the surface of the resonant body member by an air gap.

In another aspect of the present disclosure, a method for creating a passive self-polarized micromechanical resonator includes forming a resonant body member from a non-piezoelectric material, creating a plurality of charge traps on a surface of the resonant body member, and providing a charge to the resonant body member. In various embodiments, the charge traps may be created by diffusing nitrogen into the surface of the resonant body member, and thermally oxidizing the surface of the resonant body member.

BRIEF DESCRIPTION OF THE DRAWINGS

The present invention is illustratively shown and described in reference to the accompanying drawing in which:

FIGS. 2A, 2B, 20 and 2D are visual representations of a process for creating charge traps in the resonator according to various embodiments of the present disclosure;

DETAILED DESCRIPTION

The present invention will be more completely understood through the following description, which should be read in conjunction with the attached drawings. In this description, like numbers refer to similar elements within various embodiments of the present invention. Within this description, the claimed invention will be explained with respect to embodiments. The skilled artisan will readily appreciate that the methods and systems described herein are merely exemplary and that variations can be made without departing from the spirit and scope of the invention.

Figure 1:
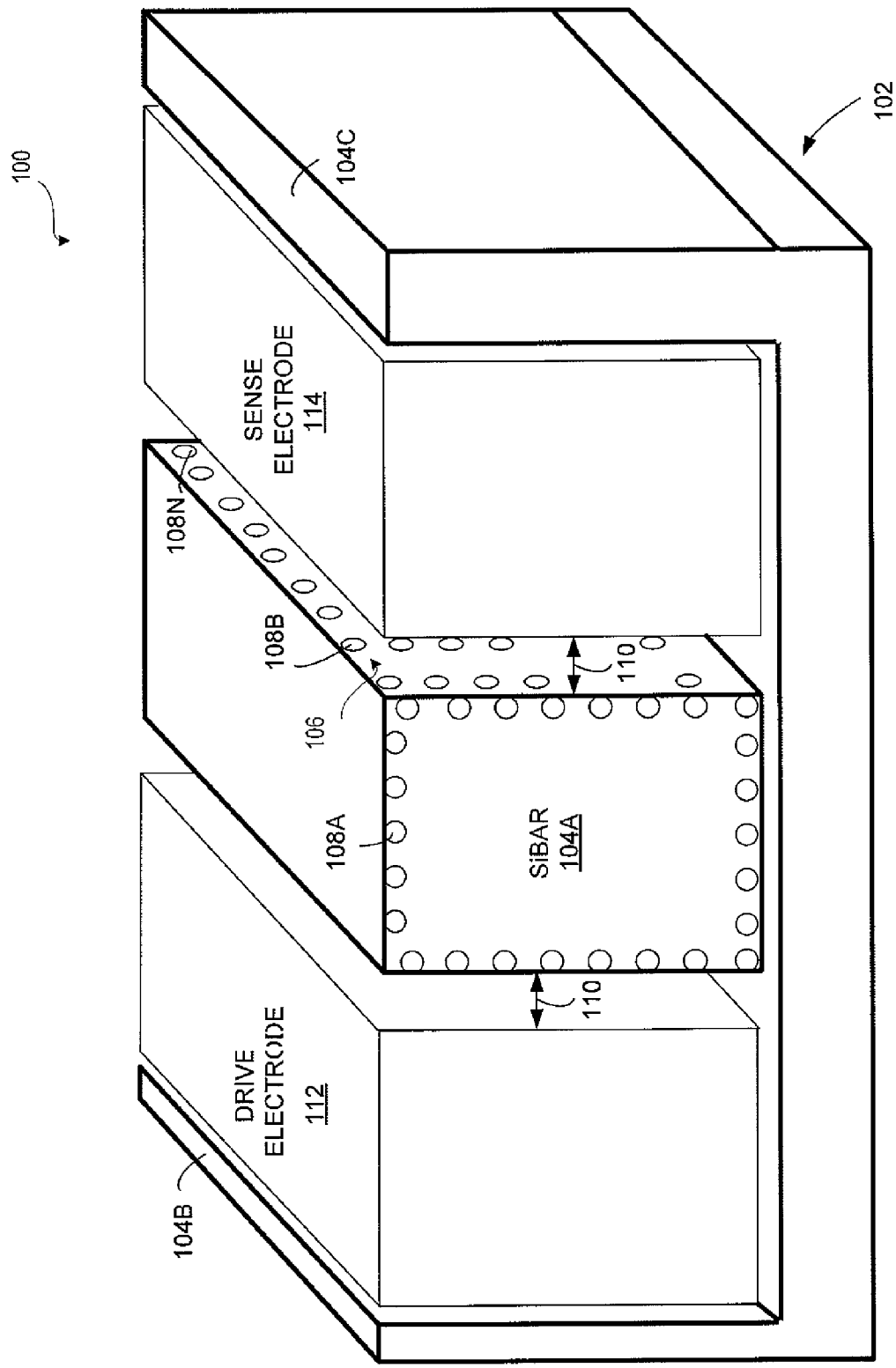
FIG. 1 illustrates a perspective view of a self-polarized capacitive micromechanical resonator apparatus according to various embodiments of the present disclosure.

Referring now to the drawings, FIG. 1 illustrates a perspective view of a self-polarized capacitive micromechanical resonator apparatus according to various embodiments of the present disclosure. As shown in FIG. 1, the self-polarized capacitive micromechanical resonator apparatus may include a self-polarized capacitive micromechanical resonator 102, which may be formed from a non-piezoelectric material, such as a silicon material. In various embodiments, the resonator 102 may be formed from a single-crystal silicon material. Furthermore, the self-polarized capacitive micromechanical resonator 102 may be a bulk acoustic resonator.

The resonator 102 may include a resonant body member 104A that is capable of retaining a polarization charge in the absence of a polarization voltage source and additional body members, such as a first body member 104B and a second body member 104C. For ease of reference, the resonant body member 104A and the additional body members, including the first and second body members 104B and 104C may generally be referred to hereinafter as body member 104. In various embodiments, the resonator 102 may be formed from a non-piezoelectric material, such as a silicon material. In some embodiments, the resonator 102 may be formed from a single-crystal silicon material. The resonant body member 104A may include a surface 106 that is characterized by a plurality of charge traps 108A, 108B-108N generally referred to hereinafter as charge traps 108. These charge traps 108 may be disposed on the surface 106 of the resonant body member 104A. In various embodiments, charge traps 108 may be implemented with wells that extend inwardly from the surface 106 of the resonant body member 104A.

The self-polarized capacitive micromechanical resonator apparatus 100 may further include one or more capacitively-coupled drive electrodes 112 and one or more sense electrodes 114. In some embodiments, the drive electrode 112 and the sense electrode 114 surround and are separated from the resonant body member 104A of the resonator 102 by capacitive air gaps 110. In various embodiments, the drive electrodes 112 and the sense electrodes 114 may be oriented such that at least one of the drive electrodes 112 or sense electrodes 114 are adjacent to the surface 106 of the resonant body member 104A.

According to various embodiments of the present disclosure, the self-polarized capacitive micromechanical resonator 100, which comprises resonator body member 102 and support circuitry may be a passive self-polarized capacitive micromechanical resonator apparatus 100. In other words, the self-polarized capacitive micromechanical resonator apparatus may retain a charge without the need for any external event to occur. In the past, a DC polarization voltage ($V_p$) was typically applied externally to a bulk acoustic wave resonator to generate an electrostatic field in the narrow capacitive air-gaps. However, in various embodiments of the present disclosure, the resonator 102 may operate without an external DC source providing the $V_p$. According to some embodiments, when an AC voltage is applied to the drive electrode 112, the resulting time-varying electrostatic force applied to the corresponding face of the resonator 102 may induce an acoustic wave that propagates through the resonator 102. At the target frequency ($f_0$) determined by W, the resulting width-extensional mode of resonance modulates the transduction air-gap 106B on the other side inducing a voltage on the sense electrode 114.

Currently, silicon bulk acoustic resonators are primarily fabricated using the conventional HARPSS process to achieve very high aspect-ratio air-gaps for electrostatic transduction. In the conventional HARPSS process, trenches etched in silicon using the DRIE process to define the dimensions of the silicon bulk acoustic resonator, while a subsequent thermally grown silicon dioxide sacrificial layer defines the air-gap between the silicon bulk acoustic resonator and the drive/sense polysilicon electrodes.

Figure 2A:
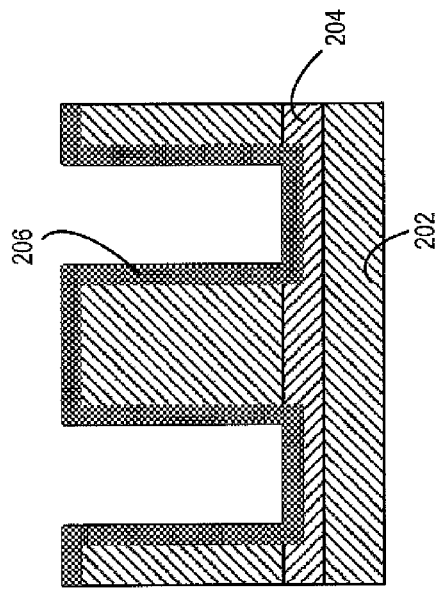

Referring now to FIGS. 2A, 2B, 2C and 2D, a visual representation of a process for creating charge traps 108 in the resonator 102 in accordance with various embodiments is shown. In some embodiments, high aspect ratio body members 104 may be implemented in the resonator 102 using a combined polysilicon and single crystal-silicon micro-machining process known in the art as HARPSS. In various embodiments, the high aspect ratio body members 104 may have one or more trenches formed therein. In particular, FIG. 2A shows a resonator made from a silicon medium 202 having a native oxide layer 204 formed thereon.

Figure 2B:
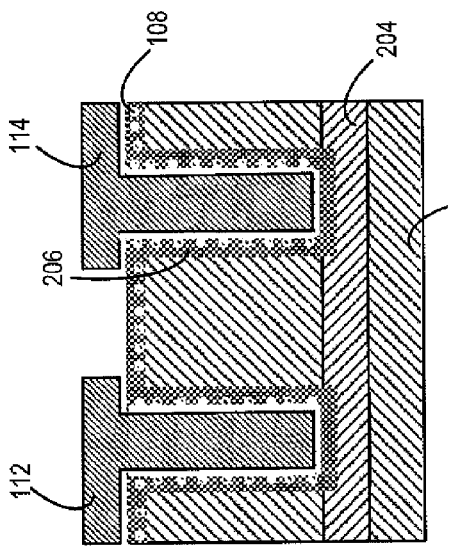

Upon implementing the high aspect ratio body members 104 in the resonator 102, the surface of the resonator 102 may be diffused with a chemical, such as nitrogen. In one embodiment, the resonator 102 may be annealed in nitrogen ambient at approximately 1100° C. for approximately one hour. In various embodiments in which the resonator 102 is made of a silicon material, by annealing the resonator 102 in nitrogen at high temperatures, the nitrogen may diffuse into the surface 106 of the body members 104 creating a thin, Silicon Rich Silicon-Nitride Layer (SRN). For example, as shown in FIG. 2B, the SRN layer 206 is shown on the surface of the resonator 102.

Figure 2C:
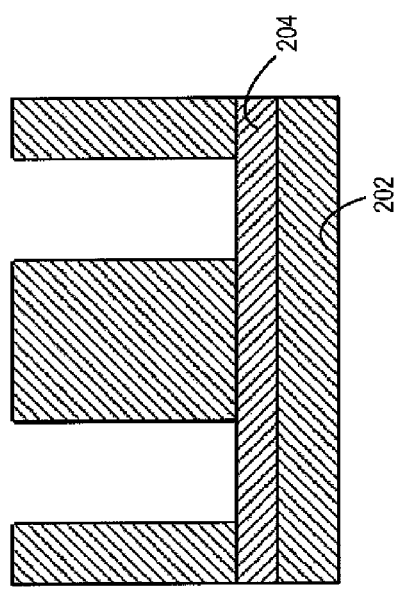

Referring now to FIG. 2C, the resonator 102 having the Silicon-Nitride layer 206 may then be subjected to thermal oxidation. When the resonator 102 is thermally oxidized, strain due to the oxidation of silicon through the thin SRN layer 206 weakens the silicon-nitrogen bond resulting in dangling bonds near the oxide-nitride interface that act as charge traps. In this way, high densities of charge traps 108, conceptually shown as charge traps 108, are created in the SRN layer 206 of the resonator 102. In addition, an oxide layer 208 is formed on the outer surface of the resonator 102.

Figure 2D:
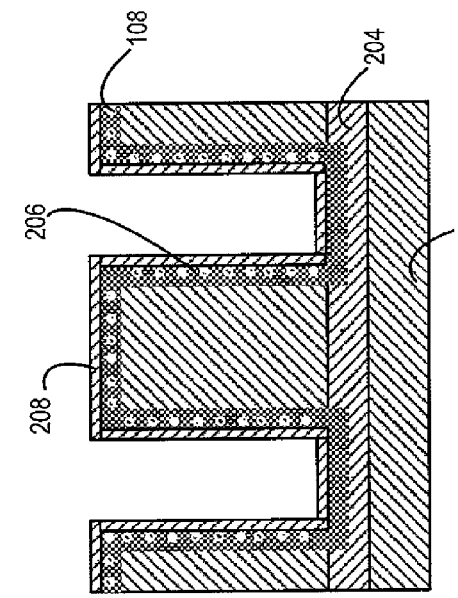

Referring now to FIG. 2D, polysilicon drive and sense electrodes may be implemented in the high aspect trenches formed in the resonator 102 above the oxide layer 208 formed on the surface of the resonator 102. Since the thermal oxide 208 defines the capacitive air-gaps 110 between the resonator 102 and the drive and sense electrodes 112, 114, the thermal oxide layer 208 formed on the surface of the resonator 102 may be removed by exposing the resonator 102 to a chemical, such as hydrofluoric acid (HF). In this way, upon the removal of the thermal oxide layer 208 from the surface of the resonator, the charge traps 108 on the surface of the resonator 102 facing the electrodes 112, 114 may be exposed. Therefore, any external charge injected into the resonator 102 may create a charge front that propagates through the resonator 102. In various embodiments, the charge traps 108 may be sequentially filled via Fowler-Nordheim tunneling. Further, the charge traps 108 may be amphoteric such that the charge traps 108 can be filled with either electrons from the conduction band or holes from the valence band of the resonator 102.

Figure 3:
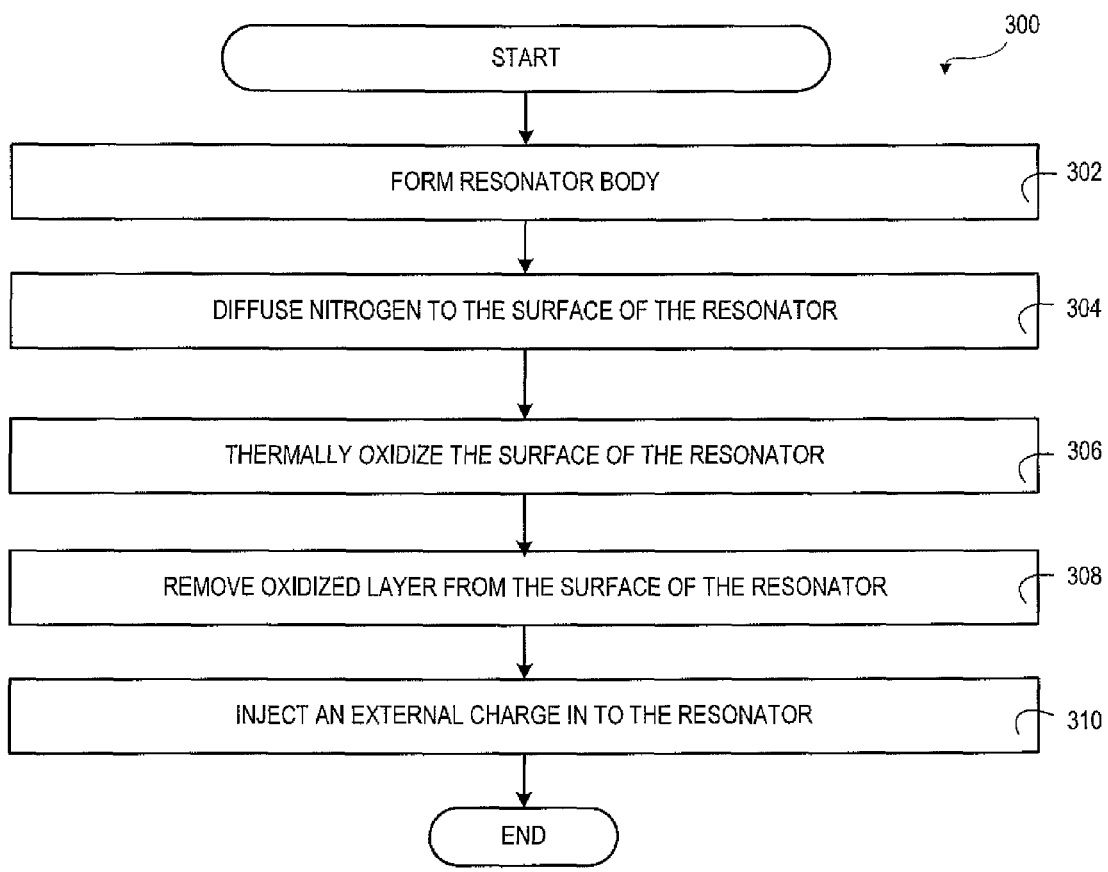
FIG. 3 illustrates a flow diagram illustrating the process of creating charge traps as shown in FIGS. 2A, 2B, 2C and 2D according to various embodiments of the present disclosure.

FIG. 3 illustrates a flow diagram illustrating the process of creating charge traps as shown in FIGS. 2A-D in accordance with embodiments of the present disclosure. A routine 300 begins at operation 302, where high aspect ratio body members 104 may be implemented in the resonator 102. In various embodiments, the high aspect ratio body members 104 may be etched onto the surface of the resonator 102 using a combined polysilicon and single crystal-silicon micro-machining process known in the art as HARPSS. From operation 302, the routine 300 proceeds to operation 304, where a chemical, such as nitrogen, is diffused onto the surface 106 of the body member 104. In various embodiments, nitrogen may be diffused onto the surface of the body member 104 by annealing the resonator 102 in nitrogen at high temperatures. In one embodiment, the resonator 102 is annealed in nitrogen at approximately 1100° C. for a duration of approximately one hour.

From operation 304, the routine 300 proceeds to operation 306, where the annealed resonator 102 is thermally oxidized.

Through thermal oxidation, capacitive air-gaps 110 may be defined between the resonant body member 104A and electrodes 112, 114. It should be appreciated that commonly known methods of thermal oxidation may be utilized. From operation 306, the routine 300 proceeds to operation 308, where a layer of the thermally oxidized surface 106 of the resonant body member 104A may be removed such that the charge traps 108 are exposed. In various embodiments, a layer of the thermally oxidized surface 106 of the body member 104 may be removed by exposing the resonator 102 to hydrofluoric acid (HF).

From operation 308, the routine 300 proceeds to operation 310, where an external charge is injected into the resonator 102. In this way, the external charge may permeate through the resonator 102 and the body member 104 and fill one or more of the charge traps 108. From operation 310, the routine 300 ends at operation 312.

In various embodiments, the resonant body member 104A may be suspended from the resonator 102 via $V_p$ pads. In this past, a voltage source provided a voltage to the resonant body member via the $V_p$ pad. However, the present disclosure is directed towards a resonator apparatus capable of retaining a polarization charge without an active polarization voltage source. As such, the $V_p$ pad may be utilized to suspend the resonant body member 104A but may not be configured to provide access to an active polarization voltage source.

Figure 4:
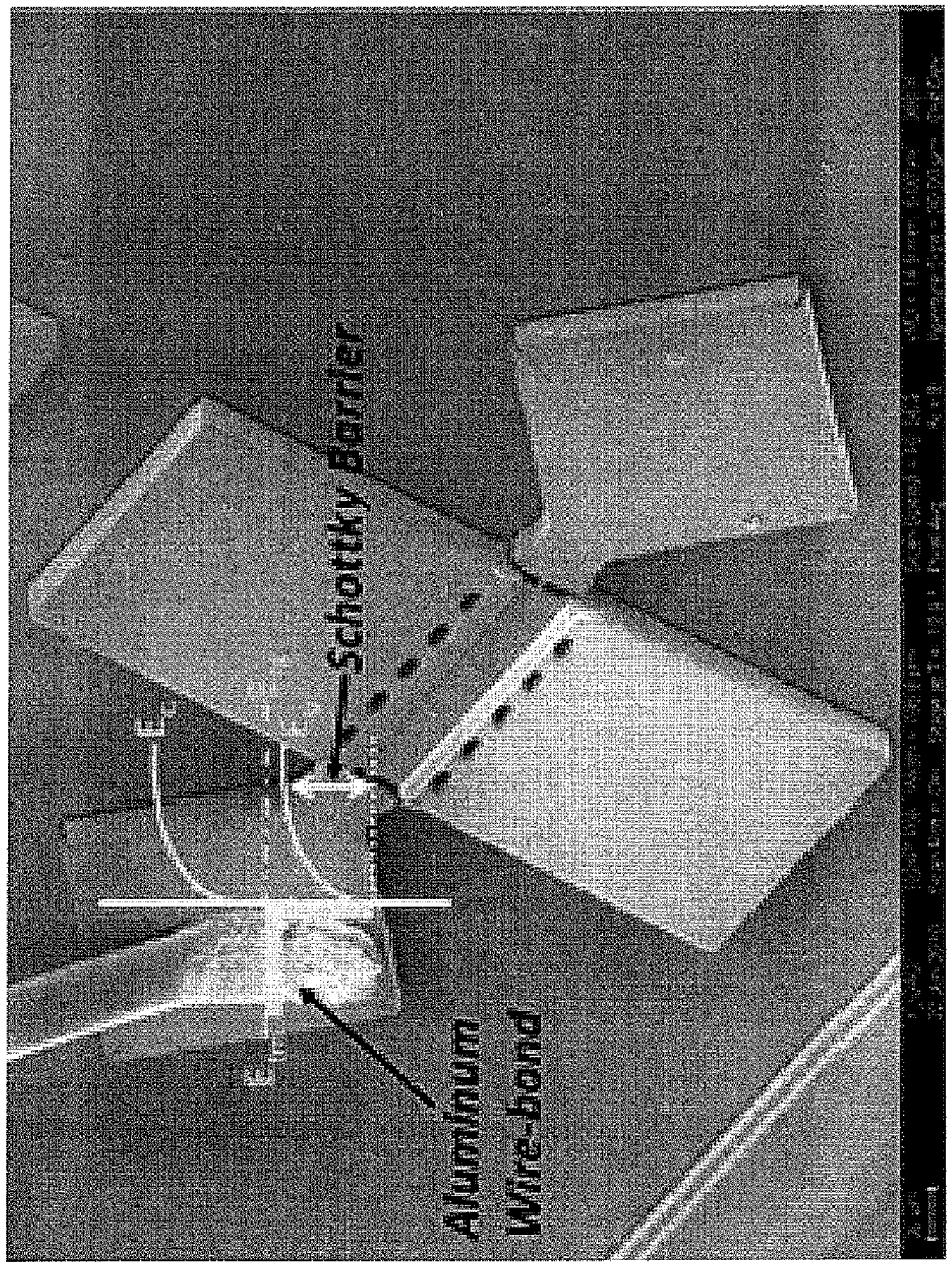
FIG. 4 shows an SEM image of the self-polarized capacitive micromechanical resonator apparatus with an ultrasonically wire-bonded aluminum wire according to various embodiments of the present disclosure.

Referring now to FIG. 4, an SEM image of the self-polarized capacitive micromechanical resonator apparatus with an ultrasonically wire-bonded aluminum wire is shown. During the fabrication process, the charge traps 108 may be filled by electrostatically inserting charges in the charge traps 108. Electrostatic discharge (ESD) during ultrasonic bonding of a conductor, such as an aluminum wire, may be sufficient to create the necessary charge injection for filling the charge traps 108, thereby charging the surface 106 of the resonant body member 104A and mimicking a polarization voltage ($V_p$). In this way, the resonator 102 can be electrostatically transduced as-is without the application of any external $V_p$ (i.e., zero-$V_p$ operation).

In addition to the potential barrier of the charge traps, a very narrow Schottky barrier may form at the interface between the conductor and very highly-doped silicon resonator 102 to further prevent the back flow of trapped charges unless an externally-applied $V_p$ forces the charge carriers to tunnel through the Schottky barrier. Though ideally an infinite retention time of the trapped charges is possible in the charge traps 108, exposure to atmospheric humidity and subsequent growth of native oxide on the surface of a non-encapsulated resonator 102 may reduce the trapped charge density over time. As a result, a progressive attenuation of the signal strength may be observed over time. In one embodiment, a progressive attenuation of the signal strength by ~5 dB is observed over 4~5 weeks. In various embodiments, the native oxide formed on the surface of the body member may be removed by exposing the resonator in HF, resulting in the signal being restored back to its original strength. In various embodiments, such leakage of trapped charges over time could potentially be avoided by hermetically encapsulating the resonator 102, thereby offering long-term stable zero-$V_p$ operation. In one example, the resonator may be hermetically encapsulated via wafer level packaging.

Figure 5:
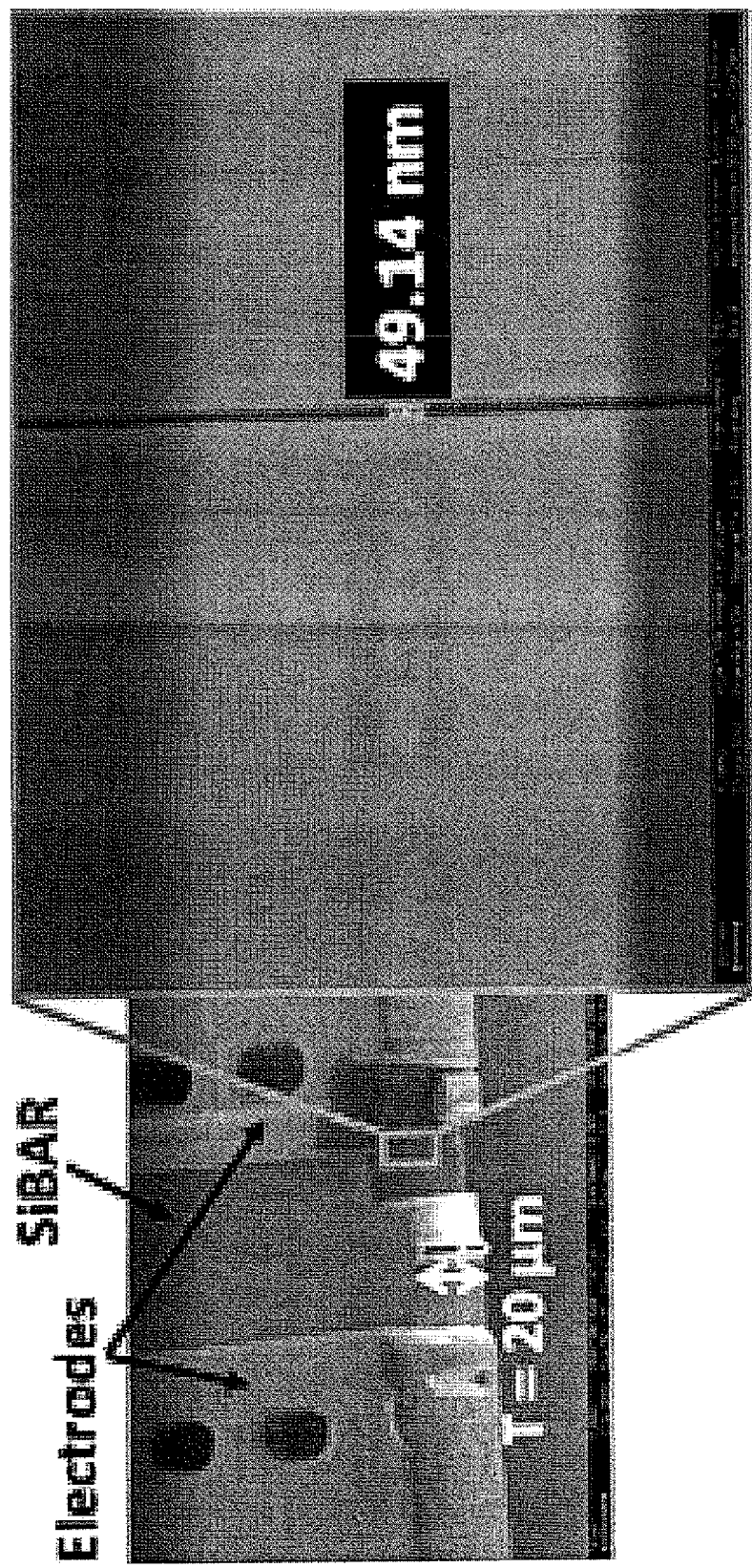
FIG. 5 shows a focused ion beam image of an exemplary capacitive air-gap between the self-polarized capacitive micromechanical resonator and the electrodes according to various embodiments of the present disclosure.

FIG. 5 shows a focused ion beam of an exemplary capacitive air-gap between the self-polarized capacitive micromechanical resonator and the electrodes. According to various embodiments, during the process of manufacturing the resonator apparatus 100, ion milling using focused ion beams (FIB) may reveal an ultra uniform and smooth narrow capacitive air-gap of ~50 nm between the resonator 102 and the electrodes 112, 114 as a result of diffusing nitrogen on the surface 106 of the resonant body member 104A. According to embodiments, high temperature nitrogen annealing may help to reflow the silicon slightly on the sidewalls of the resonant body member 104A, which in turn greatly reduces the roughness of the surface 106. As a result, the resonator 102 may be able to form reliable sub-100-nanometer air-gaps 110. As a result of nitrogen annealing, an ultra-uniform and smooth capacitive air-gap as small as 50 nm may be realized for a substrate thickness of 20 μm, resulting in very high aspect-ratio air-gaps of approximately 400:1.

Figure 6:
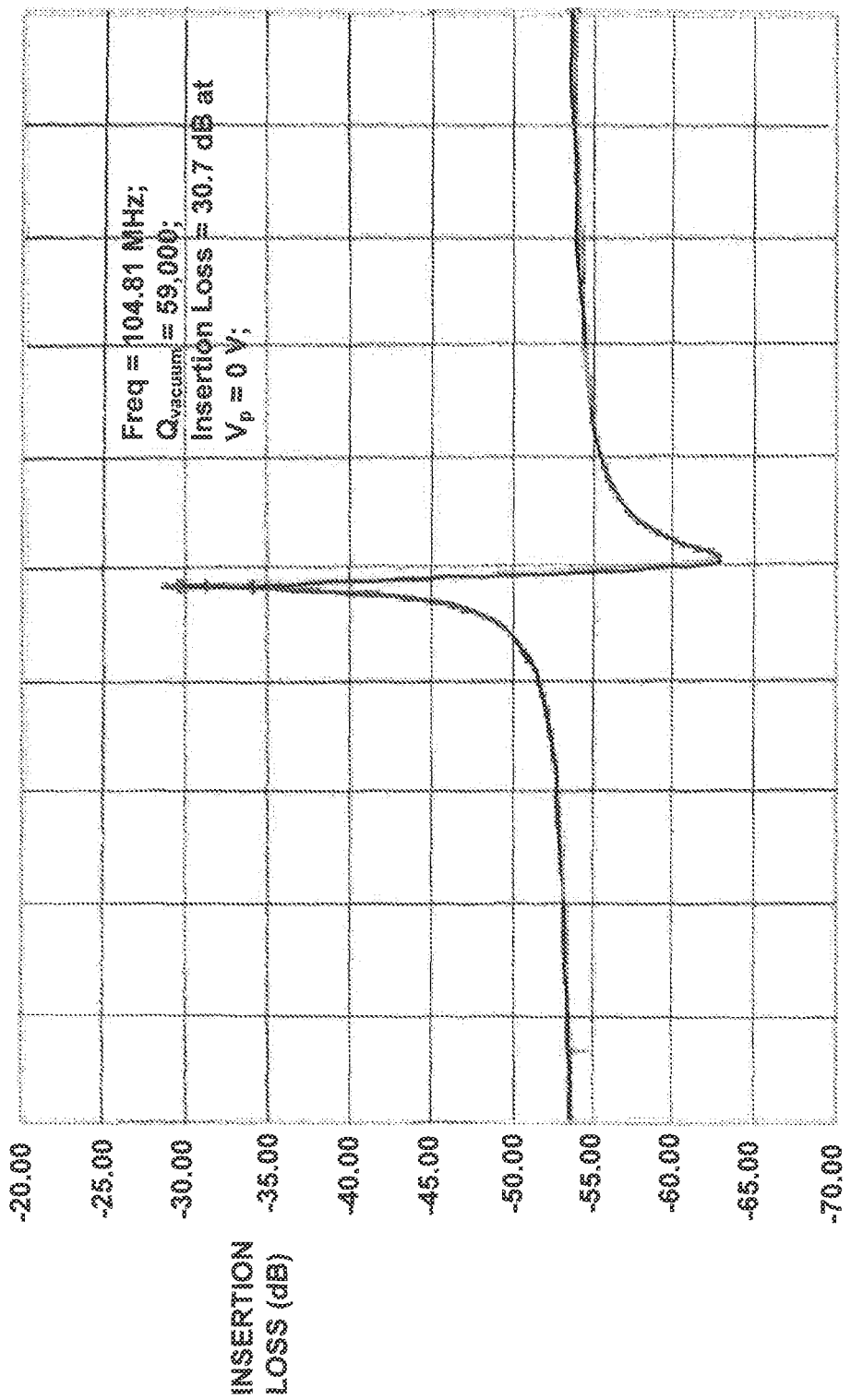
FIG. 6 is a measured response in vacuum from an exemplary self-polarized resonator according to various embodiments of the present disclosure.

Referring now to FIG. 6, a measured response in vacuum from an exemplary resonator is shown. In various embodiments, without any external $V_p$ being applied, an insertion loss of approximately 30.7 dB and a quality factor (Q) of approximately 59,000 may be measured for a resonator, such as the resonator 102 in vacuum at a resonance frequency of approximately 104.81 MHz.

The response is unchanged if the other end of the c is connected to ground or left floating. Although an attenuation of signal is observed with time, the variation in resonance frequency is extremely small. The zero-$V_p$ resonance peak comes up to ~25 dB from the noise floor without any parasitic de-embedding. With an fQ of $6.18 \times 10^{12}$ such ultra-narrow-gap self-polarized capacitive resonators, such as the resonator 102, are well suited for ultra-low-power oscillator and sensor applications. As shown in FIG. 6, the resonance peak may be independent of varying input power levels. In addition, frequency doubling may not occur in the self-polarized resonator 102.

Figure 7A:
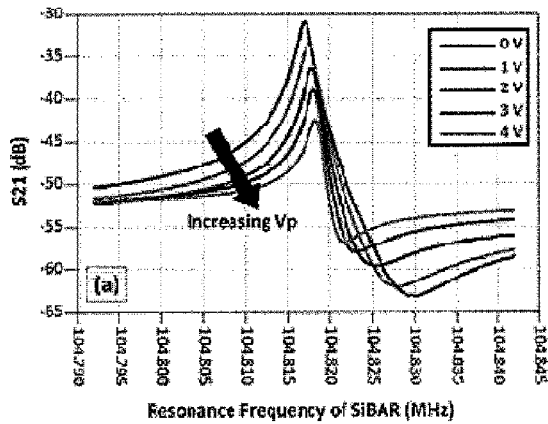
FIGS. 7A, 7B, 7C and 7D show a series of graphs illustrating motional impedance (Rm) of the resonance peak of a self-polarized resonator at various external voltage source values according to various embodiments of the present disclosure.
Figure 7B:
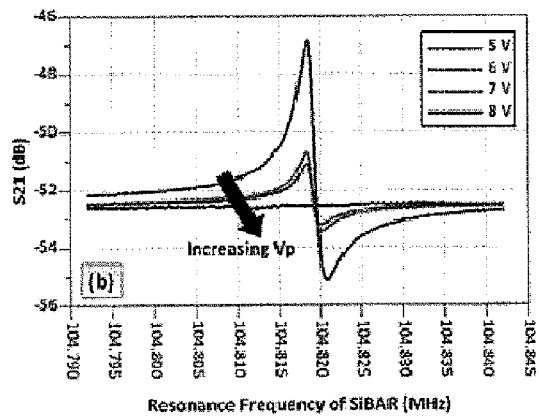
Figure 7C:
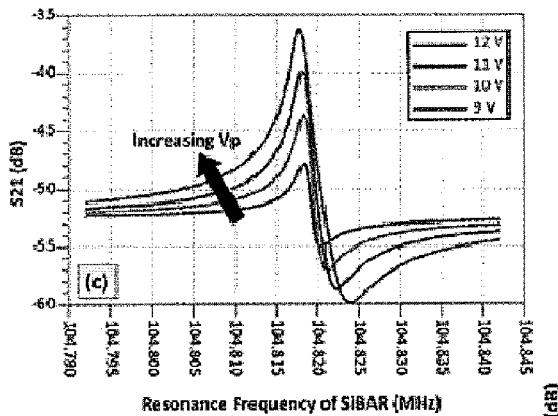
Figure 7D:
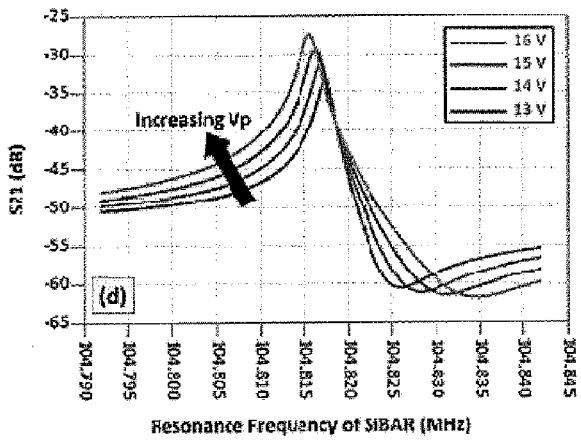

Referring to FIGS. 7A, 7B, 7C and 7D, graphs illustrating motional impedance ($R_m$) of the resonance peak at various voltage source values in accordance with various embodiments are shown. As the $V_p$ increases from 0 V to 7 V as shown in FIGS. 7A and 7B, the motional impedance ($R_m$) of the resonance peak consistently becomes large only to measure a flat 'no-peak' response at a $V_p$ of 8 V, as shown in FIG. 7B. It can be inferred that the charges in the traps mimic a $V_p$ of 8 V and are forced to recombine under an externally applied $V_p$ thereby effectively reducing the strength of the zero-$V_p$ peak. As the $V_p$ increases from 9 V to 16 V, the peak reappears and consistently improves indicating the onset of normal capacitive resonator operation as shown in FIGS. 7C and 7D. It should be appreciated that since the charge traps 108 are amphoteric in nature, similar responses may be recorded for negative polarities of $V_p$.

Figure 8:
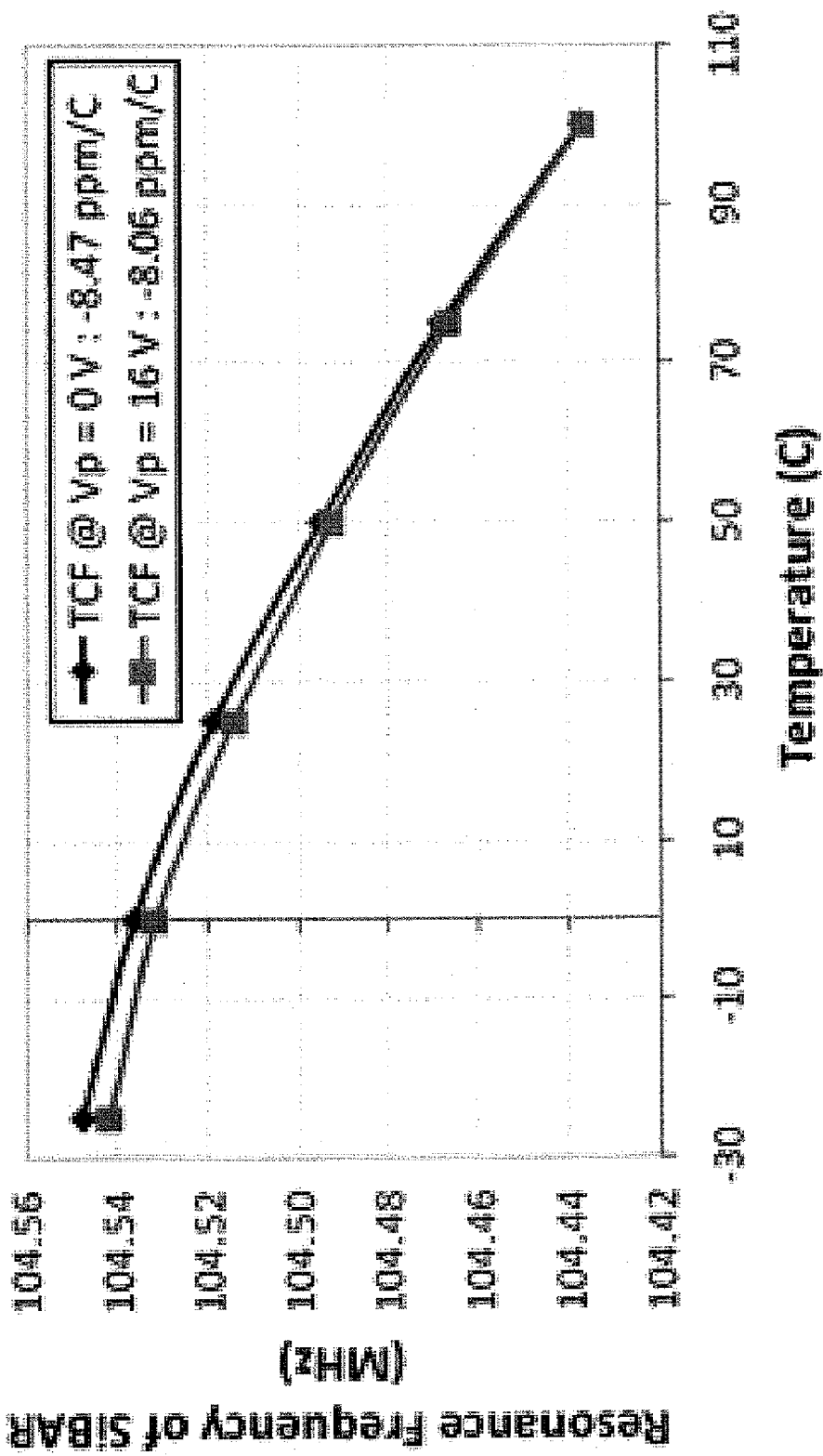
FIG. 8 shows a graph illustrating measured Temperature Coefficient of Frequency of a self-polarized resonator with and without an externally-applied Vp of 16 V according to various embodiments of the present disclosure.

Referring now to FIG. 8, a graph illustrating measured Temperature Coefficient of Frequency of a self-polarized resonator with and without an externally-applied $V_p$ of 16 V is shown. It should be noted that the Temperature Coefficient of Frequency (TCF) of the resonator 102 may be similar for resonances both with and without externally-applied $V_p$. In one embodiment, the resonator may have a TCF value of approximately −8 ppm/° C., which corresponds well to the p-type substrate resistivity of <0.001 ohm-cm and is the lowest TCF measured to date from a commercially available, highly-doped silicon substrate. Due to their very narrow capacitive gaps (50 nm) and relatively thicker substrates (20 μm), these resonators 102 may have an insertion loss of 17.5 dB and a Quality Factor (Q) of 18,000 in air at a $V_p$ of 22 V. The lowest insertion loss previously reported in silicon based bulk acoustic resonators was 22.5 dB and was measured in vacuum and at thrice the $V_p$. Such self-polarized silicon based bulk acoustic resonators may be utilized for implementation of ultra-low-power and low-cost oscillators and resonant sensing platforms.

As described above, there is a need for capacitive mechanism solutions that do not require an externally-applied DC voltage or DC bias source. According to various embodiments of the present disclosure, a charge trapping technique may be implemented as a viable passive biasing mechanism for capacitive silicon micromechanical resonators. Potential wells are created on the surface of the micromechanical resonator to trap charges for mimicking a polarization voltage ($V_p$). Unless perturbed externally, the charges remain trapped thus enabling a self-polarization technique without the need for any externally applied $V_p$. Accordingly, a self-polarized capacitive micromechanical resonator having charge traps may be able to operate without the need of an externally applied $V_p$.

The present invention is illustratively described above in reference to the disclosed embodiments. Various modifications and changes may be made to the disclosed embodiments by persons skilled in the art without departing from the scope of the present invention as defined in the appended claims.

What is claimed is:

1. A self polarized capacitive micro-mechanical resonator apparatus comprising a bulk acoustic resonator body member capable of retaining a polarization charge in the absence of an active polarization voltage source.

2. A self polarized capacitive micro-mechanical resonator comprising a bulk acoustic resonator body member formed from a non-piezoelectric material.

3. A capacitive micro-mechanical resonator apparatus comprising:
   a resonant body member capable of passively retaining a polarization charge,
   the resonant body member comprising a surface area characterized by a plurality of charge traps,
   the plurality of charge traps comprising a plurality of wells extending inwardly from the surface area of the resonant body member.

4. The apparatus of claim 3 capable of retaining a polarization charge without an active polarization voltage source.

5. The apparatus of claim 3 comprising the resonant body member formed from a non-piezoelectric material.

6. The apparatus of claim 3 comprising a resonant body member formed from a silicon material.

7. The apparatus of claim 6 wherein the silicon material is a single-crystal silicon material.

8. The apparatus of claim 3 wherein the resonant body member comprises a bulk acoustic resonator.

9. A self polarized capacitive micro-mechanical resonator apparatus comprising:
   a resonant body member; and
   at least one electrode adjacent a surface of the resonant body member and separated therefrom by an air gap,
   wherein the surface of the resonant body member adjacent the at least one electrode is characterized by a plurality of charge traps, the plurality of charge traps comprising a plurality of wells extending inwardly from the surface of the resonant body member, and
   wherein the resonant body member is capable of retaining a polarization charge without an active polarization voltage source.

10. The apparatus of claim 9 wherein the at least one electrode comprises a plurality of electrodes adjacent to the surface of the resonant body member and separated therefrom by air gaps.

11. The apparatus of claim 10 wherein the surface of the resonant body member adjacent the plurality of electrodes are characterized by the plurality of charge traps disposed thereon.

12. A method for creating a passive self-polarized micromechanical resonator comprising:
   A) forming a resonant body member from a non-piezoelectric material;
   B) creating a plurality of charge traps on a surface of the resonator body, the charge traps comprising a plurality of wells extending inwardly from the surface of the resonant body member; and
   C) providing a charge to the resonator body.

13. The method of claim 12 further comprising:
   D) forming at least one electrode adjacent the surface of the resonant body member and separated therefrom by an air gap.

14. The method of claim 13 wherein D) further comprising:
   D1) wherein the forming of at least one electrode comprises forming a plurality of electrodes adjacent the surface of the resonant body member and separated therefrom by air gaps.

15. A method for creating a passive self-polarized micromechanical resonator comprising:
   A) forming a resonant body member from a non-piezoelectric material;
   B) diffusing nitrogen into the surface of the resonant body member;
   C) allowing a thermal oxidation layer to form adjacent the nitrogen diffused surface of the resonant body member;
   D) forming at least one or more electrodes adjacent the thermal oxidation layer; and
   E) removing the thermal oxidation layer to create air gaps between the at least one or more electrodes and the nitrogen diffused surface of the resonant body member.

16. The method of claim 15 further comprising:
   F) providing a charge to the resonant body member.

* * * * *